(12) United States Patent
Kojima et al.

(10) Patent No.: US 7,638,463 B2
(45) Date of Patent: Dec. 29, 2009

(54) METHOD OF FORMING OXIDE SUPERCONDUCTOR THICK FILM

(75) Inventors: Masahiro Kojima, Tokyo (JP);
Masakazu Kawahara, Tokyo (JP);
Michiharu Ichikawa, Kanagawa (JP);
Hiroyuki Kado, Kanagawa (JP)

(73) Assignees: DOWA Electronics Materials Co., Ltd., Tokyo (JP); Central Research Institute of Electric Power Industry, Yokosuka-shi (JP)

( * ) Notice: Subject to any disclaimer, the term of this patent is extended or adjusted under 35 U.S.C. 154(b) by 0 days.

(21) Appl. No.: 12/086,583

(22) PCT Filed: Dec. 15, 2006

(86) PCT No.: PCT/JP2006/325044

§ 371 (c)(1),
(2), (4) Date: Aug. 20, 2008

(87) PCT Pub. No.: WO2007/069723

PCT Pub. Date: Jun. 21, 2007

(65) Prior Publication Data

US 2009/0036314 A1    Feb. 5, 2009

(30) Foreign Application Priority Data

Dec. 16, 2005 (JP) .............................. 2005-364094

(51) Int. Cl.
*H01L 12/00* (2006.01)
*B05D 5/12* (2006.01)

(52) U.S. Cl. ...................... 505/234; 505/471; 505/741; 427/62

(58) Field of Classification Search ................ 505/234, 505/471, 501, 741; 427/62
See application file for complete search history.

(56) References Cited

U.S. PATENT DOCUMENTS

| 5,141,917 | A | * | 8/1992 | Tanaka et al. ................ 505/476 |
| 6,656,574 | B1 | * | 12/2003 | Nemelka ..................... 428/207 |
| 2003/0096709 | A1 | | 5/2003 | Kojima et al. |
| 2004/0110641 | A1 | | 6/2004 | Kojima et al. |

FOREIGN PATENT DOCUMENTS

| JP | A-2-162616 | 6/1990 |
| JP | A-2-217320 | 8/1990 |
| JP | A-2004-26625 | 1/2004 |
| JP | A-2004-182570 | 7/2004 |
| WO | WO 03019687 | * 3/2002 |

\* cited by examiner

*Primary Examiner*—Mark Kopec
(74) *Attorney, Agent, or Firm*—Oliff & Berridge, PLC

(57) ABSTRACT

To provide an oxide superconductor thick film formation method that can enhance adhesiveness of a Bi2223 thick film to a body to be processed on which the Bi2223 thick film is formed, and increase a cross-sectional area of the Bi2223 thick film, without a decrease in Jc of the Bi2223 thick film. A mixture of a compound oxide having composition Bi2212 and Pb is applied to a surface of the body to be processed, and burned to form a first thick film. An oxide superconductor thick film expressed by a general formula $(Bi, Pb)_{2+a}Sr_2Ca_2Cu_3O_z$ (where $-0.1 \leq a \leq 0.5$) is formed on the first thick film.

2 Claims, 2 Drawing Sheets

METHOD OF FORMING OXIDE SUPERCONDUCTOR THICK FILM

TECHNICAL FIELD

The present invention relates to a method of forming an oxide superconductor thick film that contains Bi, Pb, Sr, Ca, and Cu.

BACKGROUND ART

A wide variety of applied products are devised by forming an oxide superconductor in thick film form on an oxide substrate or oxide base of MgO, alumina, YSZ, or the like or on a metal substrate or metal base of Ag, Au, Pt, Ni, or the like, and causing the oxide superconductor to function. Moreover, an oxide superconductor with a high mechanical strength can be obtained by forming an oxide superconductor on such a base in thick film form.

The following method is tried as a method of forming an oxide superconductor thick film on these types of substrate or base. An oxide superconductor powder to which an appropriate organic binder is added is processed into paste form, thereby obtaining an oxide superconductor thick film manufacturing paste. This oxide superconductor thick film manufacturing paste is applied to the substrate or base using a screen printing method, a doctor blade method, a spraying method, or the like, and then burned. As a result, a polycrystalline oxide superconductor thick film is formed.

This method of forming the oxide superconductor thick film by using the oxide superconductor thick film manufacturing paste does not require an expensive single-crystal substrate and a large-scale, expensive device which needs a high-vacuum system as represented by PVD, CVD, and the like. Therefore, this method is very economical and advantageous in terms of manufacturing cost, and can be considered as a method closest to practical use.

When the case of applying this oxide superconductor thick film to a practical product is taken into consideration, from two viewpoints, i.e., a required superconducting property and a manufacturing cost including a raw material to a manufacturing process, it is regarded as desirable to use a Bi2223 thick film having composition $(Bi, Pb)_{2+a}Sr_2Ca_2Cu_3O_Z$ (typically, 0<a<0.5) as an oxide superconductor thick film material (hereafter, this composition is referred to as Bi2223, and a film having the composition Bi2223 is referred to as a Bi2223 thick film, a paste having the composition Bi2223 as a Bi2223 paste, and a powder having the composition Bi2223 as a Bi2223 synthetic powder).

In the case of applying the oxide superconductor thick film to a practical product, it is of course important to have a high critical temperature, but simultaneously a high critical current value (hereafter referred to as Ic) is necessary. It is considered that, according to a relation "Ic=oxide superconductor thick film cross-sectional area×Jc" (where Jc denotes a critical current density), a high Ic of the oxide superconductor thick film can be attained by increasing the Jc or the cross-sectional area of the oxide superconductor thick film.

Patent Document 1 describes that a thick film having a Jc of 5,000 A/cm$^2$ or more can be obtained by forming a Bi2223 thick film having a thickness of 130 μm or more on a substrate.

Also, Patent Document 2 describes that a Bi2212 thick film having composition $Bi_2Sr_2Ca_1Cu_2O_Z$ (hereafter this composition is referred to as Bi2212, and a film having the composition Bi2212 is referred to as a Bi2212 thick film, a paste having the composition Bi2212 as a Bi2212 paste, and a powder having the composition Bi2212 as a synthetic powder) is formed between a base and a Bi2223 thick film so as to suppress any fracture surface between the Bi2223 thick film and the base and thereby enhance an adhesion strength, to attain a film thickness of 200 μm.

Patent Document 1: Japanese Patent Application Publication No. 2004-26625
Patent Document 2: Japanese Patent Application Publication No. 2004-182570

DISCLOSURE OF THE INVENTION

Problems that the Invention is to Solve

However, study conducted by the inventors of the present invention shows that, though the Jc can be improved according to the invention described in above Patent Document 1, when the film thickness of the Bi2223 thick film is increased to widen the cross-sectional area for the purpose of improving the Ic, the Bi2223 thick film peels away from a body to be processed. Thus, there is a difficulty in manufacturing a Bi2223 thick film having a predetermined Ic.

Here, by using the invention described in Patent Document 2, the inventors of the present invention achieve an improvement in Ic by increasing the thickness of the Bi2223 thick film, thereby increasing the cross-sectional area, after increasing an adhesiveness between the Bi2223 thick film and the body to be processed. This structure, however, caused the Jc of the Bi2223 thick film to decrease, indicating that the improvement of the Ic by increasing the cross-sectional area of the Bi2223 thick film cannot be expected. Further, when increasing a width of the film to attain a larger cross-sectional area, peeling occurred between the base and the film.

In view of this, a problem to be solved by the present invention is to provide an oxide superconductor thick film formation method that can enhance adhesiveness between an oxide superconductor thick film and a body to be processed on which the oxide superconductor thick film is formed and increase a cross-sectional area of the oxide superconductor thick film, without a decrease in Jc.

Means to Solve the Problems

To solve the stated problem, a first means is a method of forming an oxide superconductor thick film expressed by a general formula $(Bi, Pb)_{2+a}Sr_2Ca_2Cu_3O_Z$ where $-0.1 \leq a \leq 0.5$, on a surface of a body to be processed, the method including the steps of: providing a mixture of a compound oxide and Pb on the surface of the body to be processed, the compound oxide having a general formula $Bi_2Sr_2Ca_1Cu_{2IOZ}$; burning the body to be processed on which the mixture is provided, to form a first thick film; and forming the oxide superconductor thick film expressed by the general formula $(Bi, Pb)_{2+a}Sr_2Ca_2Cu_3O_Z$ where $-0.1 \leq a \leq 0.5$, on the first thick film. A second means is the method of forming the oxide superconductor thick film according to the first means, wherein a mixture containing Pb of 10 mol % to 50 mol % based on 1 mol of the compound oxide is used as the mixture of the compound oxide having the general formula expressed by $Bi_2Sr_2Ca_1Cu_2O_Z$ and Pb.

Effects of the Invention

According to any of the first and second means, the cross-sectional area of the Bi2223 thick film formed on the surface of the body to be processed can be increased without causing peeling or a decrease in Jc.

BEST MODE FOR CARRYING OUT THE INVENTION

To solve the stated problem, the inventors of the present invention conducted study on a cause of the decrease in Jc of the Bi2223 thick film when the structure of forming the Bi2223 thick film on the Bi2212 thick film provided on the surface of the body to be processed as an intermediate film is adopted. As a result, the inventors of the present invention learned the following. Since a temperature range in which the Bi2212 paste can be in a partial molten state is narrow, temperature control cannot be performed within a temperature range in which the Bi2212 paste formed on the body to be processed can be uniformly in a partial molten state, which causes generation of a different phase. A reaction between the Bi2212 thick film and the Bi2223 thick film is inhibited by this different phase.

There may be a possibility that, by improving a method of heating the body to be processed, the entire body to be processed can be controlled within the temperature range in which the Bi2212 paste can be uniformly in a partial molten state. However, because the body to be processed needs to be larger in size in order to earn the cross-sectional area of the Bi2223 thick film, it is technically difficult to control the entire body to be processed within this temperature range. This being so, from a completely different angle, the inventors of the present invention conceived a structure in which the temperature range that allows for the partial molten state is extended by adding Pb and/or a Pb compound to a Bi2212 synthetic powder that is a raw material of the Bi2212 paste to obtain a Pb-added Bi2212 paste. According to this structure, even when the body to be processed is increased in size, the use of the Pb-added Bi2212 paste achieves a uniform partial molten state, suppresses generation of a different phase, and enables the Bi2223 thick film to be produced properly.

First, the partial molten state of the B12212 paste and the temperature range for the partial molten state are described below.

When heating the Bi2212 paste formed on the body to be processed, there is a temperature ($T_1$) at which the Bi2212 paste starts to dissolve and orients and a Bi2212 phase begins to appear. This temperature is also a temperature at which a peak intensity of XRD (X-ray diffraction) measurement improves. Accordingly, $T_1$ can be measured by the XRD measurement of the Bi2212 paste.

When the Bi2212 paste is further heated ($T_2$), the Bi2212 phase decomposes and a Bi2201 phase begins to appear. This generation of the Bi2201 phase is recognized as the cause of making the composition of the Bi2212 thick film nonuniform. The different phase generated here inhibits proper generation of a Bi2223 phase when burning the Bi2223 thick film formed on the Bi2212 thick film. This leads to a decrease in Jc of the resulting Bi2223 thick film.

The generation of the Bi2201 phase can be measured by the XRD measurement, too. A result of measurement of $T_1$ and $T_2$ by performing the XRD measurement while heating the Bi2212 paste shows that a partial melting temperature width ($T_2-T_1$) is less than 1° C. That is, the temperature range from the measured $T_1$ to $T_2$ is a partial melting temperature of the Bi2212 paste. To achieve a uniform composition of the thick film having the composition Bi2212 and formed between the substrate or base and the Bi2223 thick film, the entire substrate or base on which this thick film is formed needs to be maintained within the range of partial melting temperature.

In view of this, the extension of the partial melting temperature width by adding Pb and/or a Pb compound to the Bi2212 synthetic powder to obtain the Pb-added Bi2212 paste is described below, with reference to Table 1.

Table 1 shows a result of measuring a relation between an additive amount and a partial melting temperature, when a Pb powder or PbO is added to the Bi2212 synthetic powder as Pb or a Pb compound. Note here that the Pb additive amount is obtained by converting an amount of Pb added to 1 mol of the Bi2212 synthetic powder, namely, by calculating what mol % Pb is added to 1 mol of the Bi2212 synthetic powder. The result of Table 1 indicates that the partial melting temperature width increases as the Pb additive amount increases.

TABLE 1

| Pb additive amount (mol %) | Partial melting temperature width (° C.) |
|---|---|
| 0 | 880 |
| 10 | 879 to 880 |
| 20 | 878 to 880 |
| 30 | 878 to 880 |
| 40 | 876 to 879 |
| 50 | 876 to 879 |
| 60 | 875 to 879 |
| 70 | 875 to 879 |

The following describes a preferred embodiment of Bi2223 thick film formation that uses the above extension of the partial melting temperature width of the Bi2212 paste, with reference to drawings.

FIG. 1 is a flowchart showing a preferred manufacturing method of a Pb-added Bi2212 paste and a Bi2223 paste used in this embodiment.

The manufacture of the Pb-added Bi2212 paste is described first.

$Bi_2O_3$, $SrCO_3$, $CaCO_3$, and CuO powders 11 are weighed so as to have the mole ratio of Bi2212 as a whole, and mixed together to obtain a mixed powder 12. Here, $CaCO_3$ may be substituted with CaO or $Ca(OH)_2$. Also, instead of performing the above powder mixture, the mixed powder 12 may be obtained by a wet coprecipitation method or the like where the mole ratio of Bi, Sr, Ca, and Cu is properly controlled.

Next, the mixed powder 12 is calcined to prepare a calcined powder 13. A calcination condition is a temperature in a range of 600° C. to 1000° C. and preferably in a range of 750° C. to 850 TC and a time period in a range of 3 hours to 50 hours, in the atmosphere. The obtained calcined powder 13 is put in a ceramic pot together with Zr balls and an organic solvent such as toluene, set on a rotating table, and ball-milled. This operation is intended to finely mill the calcined powder 13 in order to improve uniformity and also enhance thermal reactivity in next burning. The calcined powder 13 in slurry form after the completion of the milling is dried in a drier. The calcined powder 13 is then calcined again under the same condition. After this calcination, the calcined powder 13 is ball-milled again and burned to obtain a Bi2212 synthetic powder 14.

A lead compound 21 is added to the obtained synthetic powder 14. An oxide such as PbO or PbO2, a carbonate such as $PbCO_3$, or a Pb powder may be used as this lead compound. Though basically any lead compound that does not contain another metal element can be used, PbO is particularly preferable. A particle diameter of the lead compound is no larger than 10 μm, and preferably no larger than 5 μm. The additive amount of the lead compound may be appropriately determined in consideration of an extent of temperature width that is required as the partial melting temperature width explained in Table 1. From a perspective of a voiding a problem caused by excessive addition described later while ensuring a sufficient partial melting temperature width, however, the additive amount is in a range of 10 mol % to 50 mol % and more preferably in a range of 20 mol % to 40 mol % to the synthetic powder 14. Mixture after the lead compound 21 is added to the synthetic powder 14 may preferably be performed by crushing using a ball mill or the like, as it enables a particle diameter to be adjusted to the Bi2212 synthetic powder. This Pb-added Bi2212 synthetic powder is mixed with an appropriate organic solvent and organic vehicle 15, and kneaded using a triple roller or the like to obtain a Pb-added Bi2212 paste 1.

The manufacture of the Bi2223 paste is described next.

$Bi_2O_3$, PbO, $SrCO_3$, $CaCO_3$, and CuO powders 16 are added and weighed so as to have the mole ratio of Bi2223 as a whole, and mixed together to obtain a mixed powder 17. Here, $CaCO_3$ may be substituted with CaO or $Ca(OH)_2$. Also, instead of using the above different powders, the mixed powder 17 may be obtained by a wet coprecipitation method or the like where the mole ratio of Bi, Sr, Ca, and Cu is properly controlled. Also, a raw material which is prepared by a wet coprecipitation method or the like where the mole ratio of Bi, Pb, Sr, Ca, and Cu is properly controlled may be used.

Next, the mixed powder 17 is calcined to obtain a Bi2223 calcined powder 18. A calcination condition is a temperature in a range of 600° C. to 1000° C. and preferably in a range of 750° C. to 850° C. and a time period in a range of 3 hours to 50 hours, in the atmosphere.

The obtained Bi2223 calcined powder 18 is put in a ceramic pot together with Zr balls and an organic solvent such as toluene, set on a rotating table, and ball-milled. This operation is intended to finely mill the calcined powder in order to improve uniformity and also enhance thermal reactivity in next burning. The Bi2223 calcined powder 18 in slurry form after the completion of the milling is dried in a drier, and calcined again. After this, the Bi2223 calcined powder 18 is ball-milled again and burned to obtain a Bi2223 synthetic powder 19.

The obtained Bi2223 synthetic powder 19 is mixed with an appropriate organic binder and organic vehicle 20, and kneaded using a triple roller or the like to obtain a Bi2223 paste 2.

The following describes an oxide superconductor thick film manufacturing process that uses the Pb-added Bi2212 paste 1 and the Bi2223 paste 2 described above, according to the embodiment of the present invention.

FIG. 2 is a flow chart showing a process of forming the Pb-added Bi2212 paste 1 and the Bi2223 paste 2 into films on a substrate or base, where an MgO cylindrical base is used as the base as one example.

As shown in FIG. 2, a base or substrate (hereafter referred to as a base) 3 is prepared, to manufacture the base 3 on which a Bi2223 thick film 5 is formed using the Bi2223 paste 2. When doing so, a Pb-added Bi2212 thick film 4 needs to be provided between the base and the Bi2223 thick film in order to improve an adhesion strength between the base and the Bi2223 thick film.

A manufacturing method of this Pb-added Bi2212 thick film 4 is as follows. The Pb-added Bi2212 paste 1 is applied onto the base 3 and dried. After the drying is completed, the base 3 coated with the Pb-added Bi2212 paste 1 is heated in the atmosphere for a time period of 5 minutes to 30 minutes. Here, a heating temperature is within a partial melting temperature width corresponding to a Pb compound additive amount. As a result, the Pb-added Bi2212 paste 1 becomes a partial molten state, so that the Pb-added Bi2212 thick film 4 which is a first thick film is formed on the base 3.

Following this, the Bi2223 paste 2 is applied onto the base 3 on which the Pb-added Bi2212 thick film 4 is formed, and dried. After the drying is completed, the base 3 is heated in the atmosphere at a temperature of 830° C. to 860° C. for a time period of 50 hours to 100 hours, to burn the Bi2223 paste 2. The base 3 with the burned Bi2223 paste 2 is then compressed at a pressure of 2 t/cm$^2$ to 3 t/cm$^2$ using a CIP (cold isostatic press) device. Following this, the structure is further burned and compressed a predetermined number of times. After final burning, the base 3 on which the Bi2223 thick film 5 is formed is obtained.

EXAMPLE

The following describes the present invention in more detail with reference to examples, though the present invention is not limited to these examples.

First Example $Bi_2O_3$, $SrCO_3$, $CaCO_3$, and CuO powders were weighed so as to have a Bi:Sr:Ca:Cu mole ratio of 2:2:1:2, and mixed together to obtain a mixed powder. The mixed powder was calcined in the atmosphere at 780° C. for 10 hours, to obtain a calcined powder. The calcined powder was put in a ceramic pot together with zirconia balls as milling media and toluene as a solvent, set on a rotating table, and ball-milled. The calcined powder in slurry form after the completion of the ball milling was dried in a drier. After the drying was completed, the calcined powder was burned again in the atmosphere at 780° C. for 10 hours, and then ball-milled and dried. A milling condition and a drying condition of the second time are the same as those of the first time. The series of operations of "burning—milling—drying" were performed three times, to obtain a Bi2212 synthetic powder.

Next, PbO having a particle diameter of 5 μm was added to and mixed with the synthetic powder to obtain a mixed powder. The PbO additive amount here was varied by 10 mol % in a range of 0 mol % to 70 mol % to the Bi2212 synthetic powder, to thereby manufacture eight types of Pb-added Bi2212 synthetic powders.

These eight types of Pb-added Bi2212 synthetic powders were mixed with 20 Wt % terpineol or 20 Wt % butyl phthalate as an organic solvent, and 30 Wt % polyisobutyl methacrylate as an organic binder, and kneaded using a triple roller or the like. As a result, eight types of Pb-added Bi2212 pastes which vary in Pb additive amount as shown in Table 1 were obtained.

Meanwhile, a Bi2223 paste was manufactured in the same process as the above Pb-added Bi2212 pastes, except that a mixture at a Bi:Pb:Sr:Ca:Cu mole ratio of 1.85:0.35:2:2:3 was burned and PbO was not added after super conductor synthetic powder generation.

Each of the above eight types of Pb-added Bi2212 pastes was applied onto ten MgO substrates which are each 150 mm on one side by spraying, dried, and then burned in the atmosphere for 30 minutes to obtain a Pb-added Bi2212 thick film as the first thick film. Here, a burning temperature was within a partial melting temperature width of the corresponding one of the eight types of Pb-added Bi2212 pastes. An amount of each Pb-added Bi2212 paste was set so that the Pb-added Bi2212 thick film has a thickness of about 40 μm.

The Bi2223 paste was applied onto the Pb-added Bi2212 thick film formed on the MgO base by spraying, and dried. Here, a film thickness of the Bi2223 paste was 600 μm. The MgO substrate coated with the Bi2223 paste was burned at a burning temperature of 850° C. for 50 hours, and then placed in a CIP (cold isostatic press) device and compressed at a pressure of 3 ton/cm$^2$. Following this, burning, CIP compression, and burning were repeated three times under the same condition. As a result, the Bi2223 thick film on the MgO substrate was 350 μm in film thickness.

A peeling rate of the Bi2223 thick film obtained in the above manner was measured. In the measurement, a state where the Bi2223 thick film peels away from the substrate, a state where part of the Bi2223 thick film lifts from the surface of the substrate, and a state where the Bi2223 thick film grows protruding from an edge of the substrate so that a flat back surface of the Bi2223 thick film can be viewed from the back surface of the substrate, were judged as peeling states. Each of these states is a peeling phenomenon that occurs due to the presence of a fracture surface in a vicinity of an interface between the Bi2223 thick film and the MgO substrate.

A result of the measurement is shown in Table 2. The result of Table 2 indicates that, when the Pb additive amount is 10 mol % or more, the Bi2223 thick film can be stably formed without peeling, even on an MgO substrate which is 150 mm on one side, that is, an MgO substrate which has a diagonal line length of 210 mm.

When the Pb additive amount is 60 mol % or more, on the other hand, the peeling phenomenon occurs. This is because the amount of Pb being present becomes excessive and as a result a new different phase is generated. The above result indicates that the Pb additive amount is preferably no less than 10 mol % and no more than 50 mol %.

In the case where the Pb-added Bi2212 thick film was formed using the Pb-added Bi2212 paste whose Pb additive amount is no less than 10 mol % and no more than 50 mol % and the Bi2223 thick film was formed on the Pb-added Bi2212 thick film, the Jc of the Bi2223 thick film was 5000 A/cm$^2$ or more in each sample, exhibiting a favorable superconducting property. This is because, since Pb is present in the Bi2212 thick film, a Pb density decrease in a vicinity of an interface between the Bi2223 thick film and the Bi2212 thick film can be suppressed.

TABLE 2

| Pb additive amount (mol %) | Number of substrates with peeling (number) |
| --- | --- |
| 0 | 10 |
| 10 | 0 |
| 20 | 0 |
| 30 | 0 |
| 40 | 0 |
| 50 | 0 |
| 60 | 5 |
| 70 | 8 |

Second Example

The Pb-added Bi2212 paste was manufactured, with the Pb additive amount to the Bi2212 synthetic powder set at 0.3 mol %, in the same process as in the first example.

Meanwhile, as a body to be processed, ten MgO substrates are prepared respectively, being eleven kinds of square substrates with a length of one side changed for every 10 mm in a range from 50 mm to 150 mm (diagonal line lengths of these kinds of substrates are in a range of 71 mm to 212 mm).

In the same process as in the first example, the additive Bi2212 thick film was provided on each of the eleven kinds of square MgO substrates, the Bi2223 paste was applied thereto and burned, and compression and burning were performed to obtain a Bi2223 thick film of 350 μm.

Comparative Example

A Bi2223 thick film of 350 μm was formed on each of ten MgO substrates which correspond to each of the eleven kinds of square substrates with a length of one side changed for every 10 mm, in the same process as in the second example except that Pb was not added to the Bi2212 synthetic powder.

The presence or absence of peeling of the Bi2223 thick film was measured for the ten MgO substrates of each size manufactured in the second example and the comparative example. A result of the measurement is shown in Table 3.

The result of Table 3 indicates that, when the Bi2223 thick film is formed on the Pb-added Bi2212 thick film to which 30 mol % Pb is added, the peeling of the Bi2223 thick film does not occur even when the diagonal line length of the MgO substrate exceeds 212 mm. On the other hand, when the Bi2223 thick film is formed on the Bi2212 thick film to which no Pb is added, the peeling of the Bi2223 thick film occurs if the diagonal line length of the MgO substrate exceeds 150 mm, resulting in a failure to form the Bi2223 thick film.

Also, in the case of forming the Bi2223 thick film on the Pb-added Bi2212 thick film of 30 mol %, the Jc of the Bi2223 thick film was 5000 A/cm$^2$ or more in each sample, indicating that a favorable superconducting property can be maintained.

TABLE 3

| Substrate | | Second example Bi2212 paste | First comparative example Bi2212 paste |
| --- | --- | --- | --- |
| Size | Diagonal line length (mm) | with Pb | without Pb |
| | | Number of substrates with peeling (number) | |
| 50 × 50 | 71 | 0 | 0 |
| 60 × 60 | 85 | 0 | 0 |
| 70 × 70 | 99 | 0 | 0 |
| 80 × 80 | 113 | 0 | 1 |
| 90 × 90 | 127 | 0 | 2 |
| 100 × 100 | 141 | 0 | 5 |
| 110 × 110 | 156 | 0 | 10 |
| 120 × 120 | 170 | 0 | 10 |
| 130 × 130 | 184 | 0 | 10 |
| 140 × 140 | 198 | 0 | 10 |
| 150 × 150 | 212 | 0 | 10 |

NUMERICAL REFERENCES

3 Base

4 Pb-added Bi2212 thick film

5 Bi2223 thick film

Figure 1:
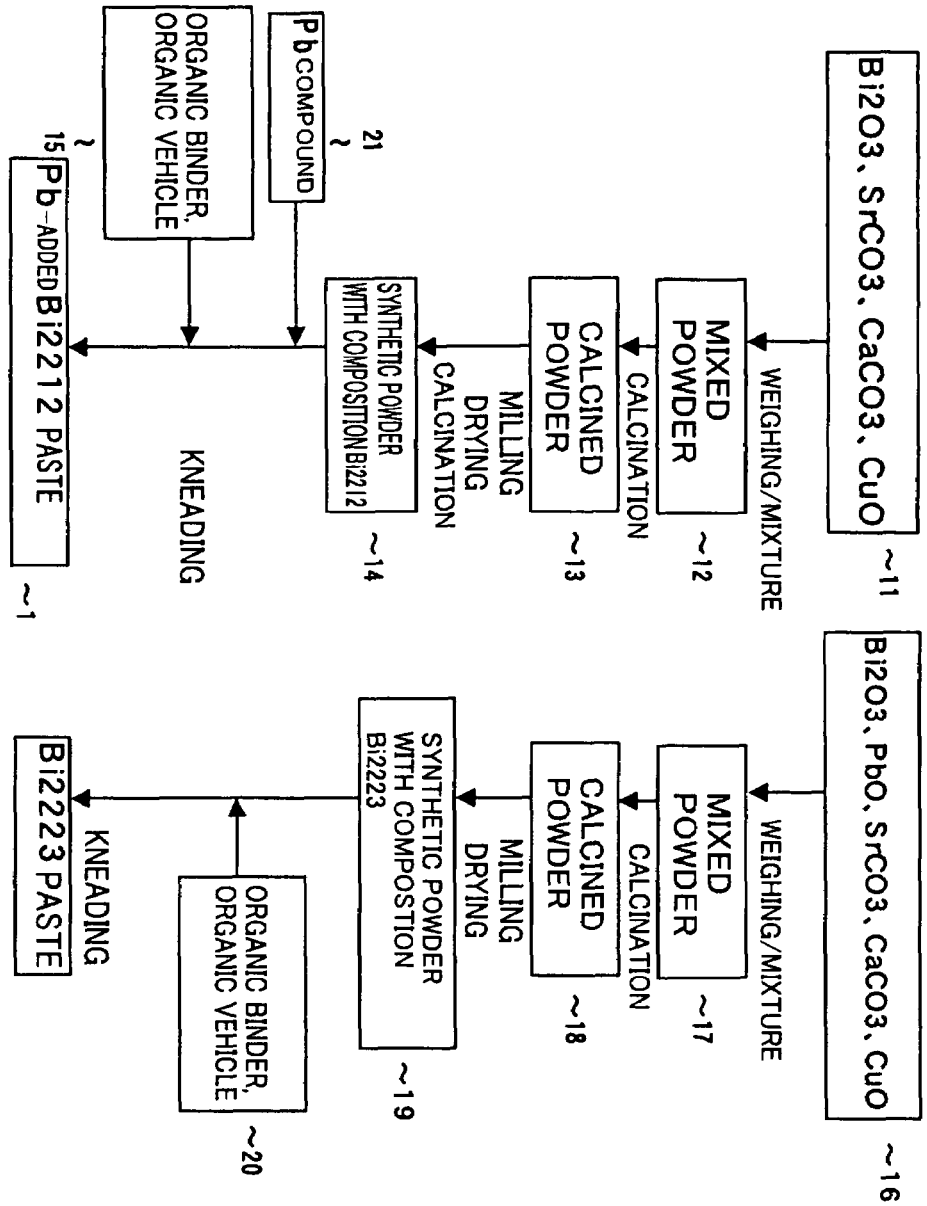
FIG. 1 is a flow chart showing an example manufacturing process of an oxide superconductor manufacturing paste.
Figure 2:
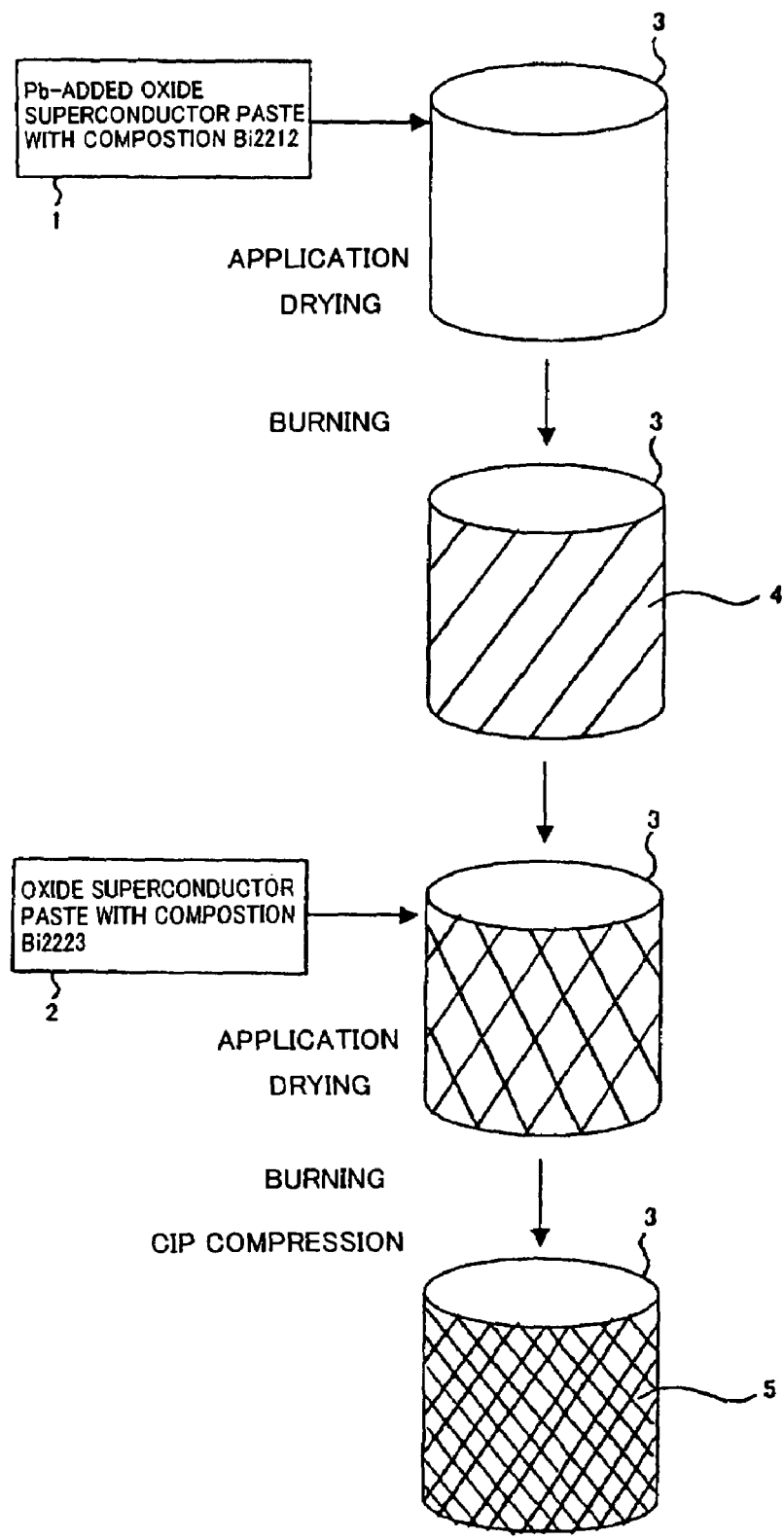
FIG. 2 is a flow chart showing an example manufacturing process of an oxide superconductor thick film.

The invention claimed is:

1. A method of forming an oxide superconductor thick film expressed by a general formula $(Bi, Pb)_{2+a}Sr_2Ca_2Cu_3O_Z$ where $-0.1 \leqq a \leqq 0.5$, on a surface of a body to be processed, the method comprising the steps of:
- providing a mixture of a compound oxide and Pb on the surface of the body to be processed, the compound oxide having a general formula $Bi_2Sr_2Ca_1Cu_2O_Z$;
- burning the body to be processed on which the mixture is provided, to form a first thick film; and
- forming the oxide superconductor thick film expressed by the general formula $(Bi, Pb)_{2+a}Sr_2Ca_2Cu_3O_Z$ where $-0.1 \leqq a \leqq 0.5$, on the first thick film.

2. The method of forming the oxide superconductor thick film according to claim 1, wherein a mixture containing Pb of 10 mol % to 50 mol % based on 1 mol of the compound oxide is used as the mixture of the compound oxide having the general formula expressed by $Bi_2Sr_2Ca_1Cu_2O_Z$ and Pb.

* * * * *